United States Patent [19]

Roman et al.

[11] 4,053,924
[45] Oct. 11, 1977

[54] ION-IMPLANTED SEMICONDUCTOR ABRUPT JUNCTION

[75] Inventors: Leonard F. Roman, North Hollywood; George H. Elliott, Granada Hills, both of Calif.

[73] Assignee: California Linear Circuits, Inc., La Mirada, Calif.

[21] Appl. No.: 710,749

[22] Filed: Aug. 2, 1976

Related U.S. Application Data

[63] Continuation of Ser. No. 548,067, Feb. 7, 1975, abandoned, which is a continuation of Ser. No. 391,779, Aug. 27, 1973, abandoned, which is a continuation of Ser. No. 196,281, Nov. 8, 1971, abandoned.

[51] Int. Cl.$^2$ .......................................... H01L 29/167
[52] U.S. Cl. .............................. 357/63; 357/91; 357/90; 357/89
[58] Field of Search ................... 357/91, 89, 90, 63

[56] References Cited
U.S. PATENT DOCUMENTS

| | | | |
|---|---|---|---|
| 3,655,457 | 4/1972 | Duffy | 148/1.5 |
| 3,723,830 | 3/1973 | Frederiksen | 317/234 R |
| 3,727,116 | 4/1973 | Thomas | 317/235 R |

Primary Examiner—Martin H. Edlow
Attorney, Agent, or Firm—Howard A. Silber

[57] ABSTRACT

A semiconductor abrupt junction having a relatively heavily doped region of first conductivity type, a relatively lightly doped region of opposite conductivity type, and immediately adjacent the effective junction, a thin "recombination layer" of first conductivity type and of dopant concentration intermediate that of the two junction regions. Preferably, the recombination layer overlaps the forward biased depletion region of the junction and has a thickness (typically 50 A to 200 A) much less than that of the junction depletion region under reverse bias. The recombination layer dopant ions thereby provide recombination-generation centers only where beneficial to improve the forward and reverse recovery times of the junction without degrading the steady state reverse current characteristics thereof. By further utilizing a very shallow (less than about 800 A) heavily doped region, very low forward turn-on voltage is achieved. The junction may be fabricated by controlled implantation of dopant ions.

12 Claims, 10 Drawing Figures

"RECOMBINATION LAYER" JUNCTION

DEPTH INTO SEMICONDUCTOR BODY

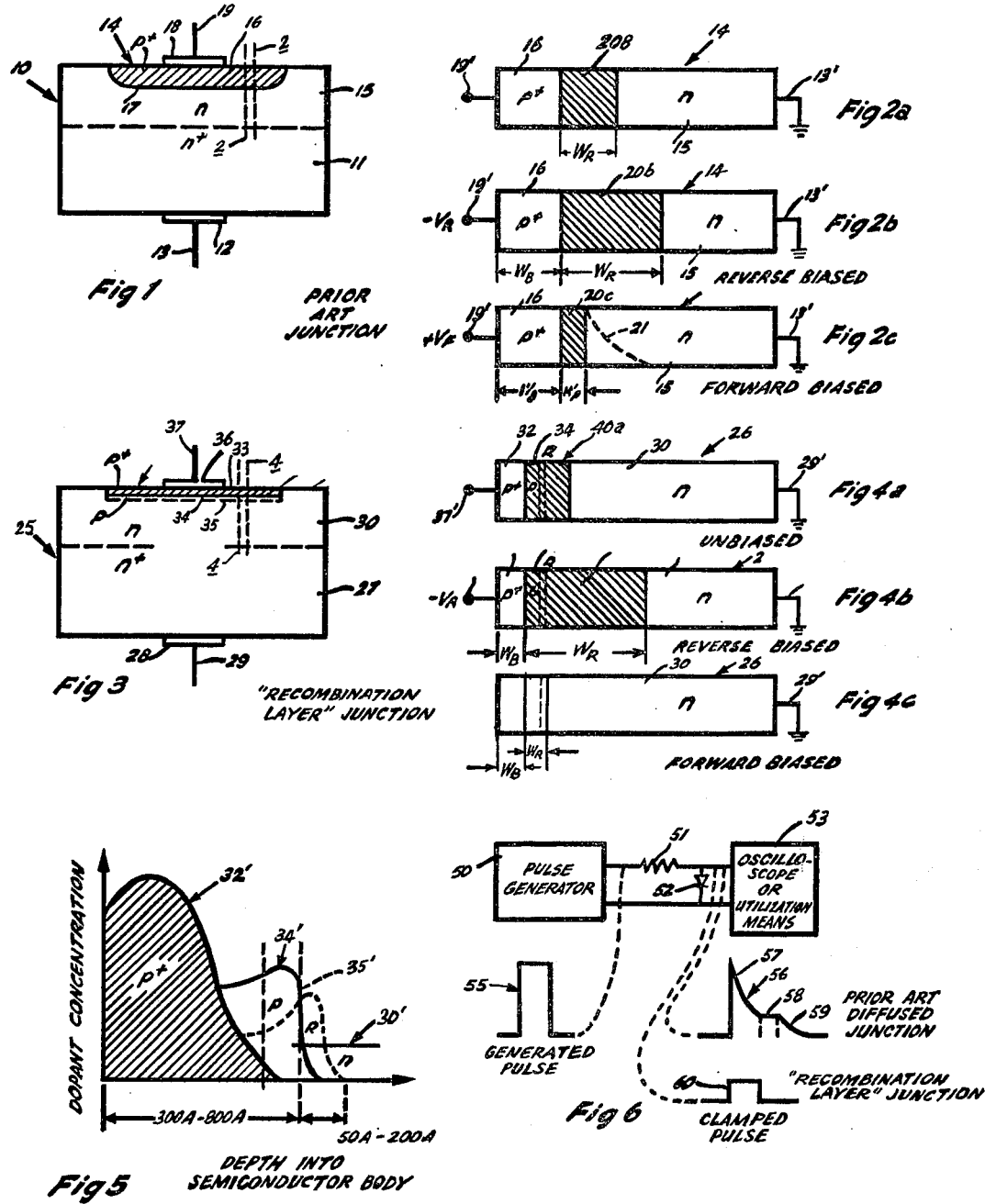

ION-IMPLANTED SEMICONDUCTOR ABRUPT JUNCTION

This is a continuation of application Ser. No. 548,067, filed Feb. 7, 1975 now abandoned, which is a continuation of Ser. No. 391,779, filed Aug. 27, 1973, abandoned, which is a continuation of Ser. No. 196,281, filed Nov. 18, 1971, abandoned.

BACKGROUND OF THE INVENTION

1. Field of the Invention

The present invention relates to a semiconductor abrupt junction having a thin recombination layer immediately adjacent to the effective junction. More particularly, the invention relates to a semiconductor junction having a shallow, highly doped region of one conductivity type, a relatively lightly doped region of opposite conductivity type and, between the two regions, a thin recombination layer of first conductivity type and of dopant concentration intermediate that of the heavily and lightly doped regions.

2. Description of the Prior Art

The operational speed of computers and other electronic circuitry rapidly is approaching the limitations inherent in individual circuit components. Thus, while the circuit designer is under ever increasing pressure to develop faster and faster circuitry, components are not available which will facilitate such high-speed operation. Significant among the items which limit circuit speed is the p-n junction, the basic constituent of semiconductor devices such as diodes, transistors and the like.

The period of time required to bring a prior art semiconductor junction into full forward conduction typically may range from several nanoseconds to a few microseconds. This forward recovery time $(T_{fr})$ may correspond to a substantial portion of a circuit operational duty cycle. Moreover, the reverse recovery time $(T_{rr})$, which is related to the time required to turn off a semiconductor diode, typically may range from about ten nanoseconds to about one hundred microseconds for prior art p-n junctions.

The forward and reverse recovery times of a p-n junction are important not only when a device is used in a switching or other computer circuit, but also when used for clamping. In such an application, if a diode is subjected to a voltage transient faster than the recovery time of the device, the transient will not be clamped. Of course, this defeats the purpose of utilizing the clamping diode, and may cause erroneous circuit operation or damage to other circuit components exposed to the unclamped transient voltage.

The ability of a clamping diode to react to very high-speed transients is particularly important in certain special purpose circuits such as the flyback dc-dc regulator. This circuit is very useful for controlling or regulating power, but requires diodes which exhibit very fast turn-on and turn-off times, and which also are capable of handling high forward current. Such diodes have not been available in the past.

In addition to fast forward and reverse recovery times, there are cognate characteristics desirable for semiconductor p-n junctions. For example, it is advantageous for such junctions to exhibit very low forward turn-on voltage. While a forward turn-on voltage of 0.2 volts at one milliampere may be exhibited by germanium diodes at 25° C, at the same current and temperature, prior art silicon diodes typically exhibit a turn-on voltage of 0.6 volts. Other desirable characteristics are that the junction should be capable of handling high current during steady state forward conduction, should exhibit low reverse current while maximizing the forward characteristics described above, and should have high stability in a radiation environment.

As discussed in detail below, these characteristics cannot simultaneously be obtained in prior art semiconductor p-n junctions. For example, consider the transient phenomenon associated with switching a prior art junction diode from forward conduction to reverse bias conditions. While the junction is conducting a steady current in the forward direction, excess minority carriers are present in the n and p regions of the junction. The minority carrier density is at a maximum adjacent the boundary with the forward biased depletion region, and decreases with increasing distance from that boundary.

When the bias voltage across the diode is reversed, the excess minority carriers first must be cleared from the n and p regions, by diffusion into and recombination within the depletion region, before the steady state reverse current condition is reached. During this reverse recovery time $(T_{rr})$, excess current flows in the reverse direction. The time required to clear the junction of stored excess minority carriers depends on the junction geometry, the dopant concentrations in the $p$ and $n$ regions, the perfection of the semiconductor matrix, and the concentration of recombination sites in the structure.

One approach widely used in the prior art to speed up the reverse recovery time of a p-n junction diode is to introduce throughout the diode an impurity dopant having an energy level near the middle of the semiconductor forbidden gap. Such impurities, examples of which are copper in germanium and gold in silicon, therefore act as efficient recombination-generation centers which speed up the clearing of excess minority carriers upon junction turn-off, and hence act to reduce the junction reverse recovery time. However, the presence of such gold or copper foreign material significantly reduces the lifetime of holes or electrons within the depletion region of the junction when reversed biased, and thereby significantly increases the steady state reverse current of the junction. Thus, this prior art technique improves one junction characteristic (reverse recovery time) at the expense of degrading another characteristic (reverse leakage).

No satisfactory technique has been available in the past to improve the forward and reverse switching characteristics of a semiconductor p-n junction without impairing other performance characteristics of the junction. In contradistinction, the present invention comprises a semiconductor junction and technique for making same; the inventive junction exhibits forward and reverse switching characteristics significantly faster than previously available. At the same time, the novel junctions provide improved forward turn-on characteristics, high steady state forward current handling ability and inherently high stability in radiation environments, all while maintaining good reverse voltage and current characteristics.

SUMMARY OF THE INVENTION

In accordance with the present invention there is provided a semiconductor p-n junction having contiguous highly doped and lightly doped regions respectively of opposite conductivity type, and characterized by a thin, intermediately doped recombination layer immediately adjacent the effective junction, and of the same conductivity as the relatively highly doped one of the regions.

In a preferred embodiment, the inventive junction comprises a semiconductor body, typically silicon, relatively lightly doped to a first (typically n) conductivity type. A shallow (e.g., 300 Å to 800 Å deep), highly doped region of opposite (typically p+) conductivity type is provided adjacent a major face of the semiconductor body. The junction also includes a thin (e.g., 50 Å to 200 Å) "recombination layer" immediately below the heavily doped region and comprising dopant ions of the same conductivity type as that region. Appropriate ohmic contacts are provided to the heavily doped region and semiconductor body.

The dopant ions in the recombination layer provide generation-recombination centers to aid, inter alia, in the recombination of excess minority carriers upon junction turn-off, and to speed forward turn-on of the junction. However, because the recombination layer is considerably thinner than the reverse biased depletion region of the junction, the generation-recombination centers provided thereby do not significantly increase the reverse leakage current of the diode. The recombination layer also is beneficial in improving other junction characteristics, such as reducing turn-on voltage and current and enhancing stability in radiation environments.

The inventive junction may be produced by controlled implantation of dopant ions. For example, in a diode comprising an n-type silicon body, the heavily doped p+ region may be produced by ion implantation of acceptor type impurities such as boron, aluminum, gallium or indium. The recombination layer is formed by increasing the ion implantation energy for a relatively short period of time to drive some of the dopant ions further into the semiconductor body. By controlling the ion implantation energy and time, a heavily doped region and a recombination layer of the desired dopant concentration, thickness and location are formed.

The dopant ion implantation of the inventive p-n junction may be accomplished using the "Apparatus and Method for Effecting the Restructuring of Materials" set forth in the inventors' U.S. Pat. No. 3,437,734, which patent is incorporated herein by reference.

Thus it is an object of the present invention to provide an improved semiconductor p-n junction.

It is another object of the present invention to provide an abrupt p-n junction characterized by a "recombination layer" immediately adjacent the effective junction.

Another object of the present invention is to provide a shallow, abrupt junction having relatively highly doped and relatively lightly doped contiguous regions respectively of opposite conductivity type, and characterized by a thin, intermediately doped recombination layer of dopant ions immediately adjacent the effective junction and of the same conductivity type as the relatively highly doped region.

Still another object of the present invention is to provide a p-n junction having a relatively lightly doped body of a first conductivity type, a relatively heavily doped region of opposite conductivity type extending to a depth of between about 300 Å and about 800 Å from a major face of the body, and having a thin (typically 50 Å to 200 Å) layer of dopant ions of said opposite conductivity disposed immediately below the heavily doped region.

It is yet another object of the present invention to provide a p-n junction formed by ion implantation, and exhibiting very fast forward and reverse recovery times and low forward turn-on voltage.

A further object of the present invention is to provide a junction fabricated in a semiconductor body by dopant ion implantation, the implanted ions having a high concentration in a shallow region adjacent a face of the body, and a lower concentration in a thin region immediately below the heavily doped region.

It is a further object of the present invention to provide a technique for producing a p-n junction comprising embedding by ion implantation dopant ions of a first conductivity type in a semiconductor body of a second conductivity type, the implantation being carried on at a first energy level for a relatively long period of time and at a somewhat higher implantation energy level for a relatively shorter period of time.

BRIEF DESCRIPTION OF THE DRAWINGS

Still other objects, features, and attendant advantages of the present invention will become apparent to those skilled in the art from a reading of the following detailed description of the preferred embodiments constructed in accordance therewith, taken in conjunction with the accompanying drawings wherein like numerals designate like parts in the several figures and wherein:

FIG. 1 is a greatly enlarged, sectional view of a diode incorporating a prior art p-n junction which may be fabricated by diffusion techniques;

FIGS. 2a, 2b and 2c are greatly enlarged, idealized representations of the p-n junction of FIG. 1, as seen generally along the lines 2—2 thereof, for unbiased, reverse biased and forward biased condition respectively;

FIG. 3 is a greatly enlarged, sectional view of a semiconductor diode incorporating a recombination layer abrupt junction in accordance with the present invention, which junction may be formed by ion implantation;

FIGS. 4a, 4b and 4c show idealized representations of the inventive p-n junction of FIG. 3, as seen generally along the lines 4—4 thereof, for unbiased, reverse biased and forward biased conditions respectively;

FIG. 5 is a graph showing dopant concentration as a function of depth into the semiconductor body for a typical p-n junction in accordance with the present invention; and FIG. 6 is a simplified electrical block diagram illustrating utilization of a clamping diode and including waveforms showing the clamping performance of a prior art diffused junction and a recombination layer junction in accordance with the present invention.

DESCRIPTION OF THE PREFERRED EMBODIMENTS

Referring now to the drawings, and particularly to FIG. 1 thereof, there is shown a semiconductor diode 10 in accordance with the prior art. Diode 10 comprises a semiconductor body having a substrate region 11 which is heavily doped of n-type conductivity. (In FIG. 1, the plus sign superscript (+) indicates relatively high dopant concentration.) An ohmic contact 12 and associated conductor 13 are attached to the lower face of highly doped substrate 11.

Still referring to FIG. 1, prior art diode 10 further comprises a p-n junction generally designated 14. Junction 14 includes a lightly doped region 15 of n-type conductivity into which is diffused a relatively highly doped region 16 of p-type conductivity. Although well defined in FIG. 1, the interface 17 between junction regions 15 and 16 may be gradual, with a dopant concentration gradient characteristic of a diffused junction. An ohmic contact 18 and conductor 19 provide electrical contact to p+ region 16. Electrical connection to n-type junction region 15 is facilitated via high conductivity n+ region 11, ohmic contact 12 and conductor 13.

Prior art diode 10 (FIG. 1) may comprise a body of single-crystal silicon, a semiconductor with four valence electrons, doped with a donor impurity such as phosphorus, antimony, bismuth or arsenic, having a valence of five and thereby donating an electron to convert the silicon to n-type conductivity. The diffused, p+ region 14 may comprise a relatively high concentration of acceptor impurity ions of boron, aluminum, gallium, or indium. These dopant ions have three valence electrons, and thus accept an electron from the valence band of the semiconductor (i.e. produce a hole) to convert the silicon to p-type conductivity. Typically, the depth of p+ region 16 for a "shallow" diffused junction is at least one micron and often ten or more microns deep.

Operation of prior art junction 14 is illustrated in a simplified fashion in FIGS. 2a, 2b and 2c for unbiased, reverse biased and forward biased conditions respectively.

Referring first to FIG. 2a, no bias voltage is applied across terminals 13' and 18' corresponding respectively to conductors 13 and 19 of FIG. 1. Under this unbiased condition, electrons from n-type region 15 flow toward p+ region 16, and holes from p+ region 16 flow toward n-type region 15. Accordingly, an electric field is produced in the vacinity of interface 17 in such a direction as to keep the holes in p+ region 16 and the electrons in n region 15. This electric field prevents further net flow of the carriers, and causes a space-charge region 20 to be formed near the junction, which region is essentially depleted of carriers. In other words, the concentrations of holes and electrons in depletion region 20 is negligibly small in comparison to the impurity dopant concentration over most of the space charge region.

The width $W_U$ of unbiased depletion region 20 is a function of the relative dopant concentrations $N_D$ and $N_A$ of n and p+ regions 15 and 16 respectively, as well as the dopant gradient at the interface therebetween. For an abrupt junction, the width $W_U$ is approximated by:

$$W_U = \sqrt{\frac{2K_s \epsilon_o}{q} \frac{N_A + N_D}{N_A N_D} \Phi_T} \quad (1)$$

wherein:
$K_s$ = dielectric constant of the semiconductor;
$\epsilon_o$ = permittivity of free space;
$q$ = magnitude of electronic charge; and
$\phi_T$ = total potential variation across space charge region 20a.

Junction 14 may be reverse biased by applying a voltage to terminal 19' (herein $-V_R$) which is negative with respect to terminal 13', as shown in FIG. 2b. If the reverse bias $-V_R$ is not so large as to cause breakdown of junction 14, a reverse current $I_R$ will flow. The mechanism giving rise to this reverse current may be understood by recognizing that during equilibrium; electron-hole pairs are generated continually everywhere within the semiconductor material of diode 10. In the absence of an applied voltage, the electron-hole pairs recombine and therefore no current flows. However, when a negative voltage is applied to the p+ region, the electron hole pairs once generated, will be separated and their probability of recombination is diminished. Accordingly, electron-hole pair generation is the basic mechanism giving rise to reverse current in p-n junction 14.

When an electron-hole pair is generated within reverse biased depletion region 20b of junction 14, the resulting current component $I_{gen}$ is called the generation current. A simplified expression for generation current $I_{gen}$ is given by the following equation:

$$I_{gen} = \frac{1}{2} q \frac{n_i}{\tau_o} W_R A_J \quad (2)$$

wherein:
$q$ = magnitude of electronic charge;
$n_i$ = intrinsic carrier concentration;
$\tau_o$ = the effective lifetime of an electron or hole within reverse biased depletion region 20b;
$W_R$ = width of reverse biased depletion 20b (and is proportional to $\sqrt{V_R}$); and
$A_J$ = cross-sectional area of p-n junction interface 17.

A derivation of the preceeding equation is included in Chapter 6 of the text entitled, "Physics and Technology of Semiconductor Devices" by A. S. Grove, published by John Wiley and Sons, Inc., New York, 1967.

When electron-hole pairs are generated in n or p+ regions 15 or 16, the carriers diffuse toward the reverse biased junction, thereby leading to additional components of the reverse current, herein called diffusion currents. The following simplified equations, also derived in the above cited text, specify the diffusion current components $I_{diff,p}$ and $I_{diff,n}$ from regions 15 and 16 respectively:

$$I_{diff,p} = qD_p \frac{n_i^2}{N_D L_p} A_J \quad (3)$$

$$I_{diff,n} = qD_n \frac{n_i^2}{N_A L_n} A_J \quad (4)$$

wherein:
$D_p$ = diffusivity of holes;
$L_p$ = diffusion length of holes;
$D_n$ = diffusivity of electrons; and
$L_n$ = diffusion length of electrons.

If the depth $W_B$ of p+ region 16 (FIG. 2b) is sufficiently shallow, (i.e., if $W_B << L_n$), then the value $W_B$ can be substituted for $L_n$ and $L_p$ in equations (3) and (4).

The total reverse current $I_R$ is given by:

$$I_R = I_{gen} + I_{diff,n} + I_{diff,p} \quad (5)$$

Note that the diffusion current components are distinguished by their lack of voltage dependence, but are temperature dependent through the intrinsic carrier concentration term $n_i$.

For silicon at room temperature, the dominant component of the reverse current is the generation current. This is particularly significant in terms of the prior art approach to increasing junction reverse recovery time. As discussed above, gold dopant ions commonly were introduced throughout prior art semiconductor junctions to decrease the value of $T_{rr}$. However, the presence of such gold dopant ions significantly reduces the lifetime $\tau_o$ of the carriers within the semiconductor. As a result, the value of $I_{gen}$ (see equation (2) above) increases, causing a corresponding increase in reverse current $I_R$ and thus degrading the reverse performance characteristics of the diode.

FIG. 2c illustrates prior art junction 14 under forward bias wherein a positive voltage $+V_F$ is applied to $p^+$ region 16 and terminal 13' is grounded. The applied potential causes excess holes to be pushed from $p^+$ region 16 toward the interface with $n$ region 15 and excess electrons to be pushed toward the interface with $p^{30}$ region 16. The electron and hole concentrations adjacent depletion region 20c thus both will be above their respective equilibrium values; under such injection conditions holes (i.e., minority carrier) will tend to diffuse into $n$ region 15 and electrons will tend to diffuse into $p^+$ region 16. This provokes an immediate flow of electrons in $n$ region 15 which recombine with holes being injected into that region. Similarly, holes flow in $p^+$ region 16 to recombine with electrons being injected into that region.

In the steady state, electrons and holes disappearing through recombination will be replenished by more electrons and holes coming in through contacts 13' and 19' respectively. This gives rise to a forward current $I_F$ due to the recombination of electron-hole pairs, in much the same way that the reverse current $I_R$, considered above, is due to the generation of electron-hole pairs in various regions of the semiconductor. As in the reverse current situation, the forward current $I_F$ includes three components, the diffusion current components $I_{diff,p}$ and $I_{diff,n}$ associated with the diffusion of minority carriers into $n$ and $p^+$ regions 15 and 16 respectively, and the recombination current component $I_{rec}$ associated with recombination in forward biased depletion region 20c.

Following the derivation of Grove, op. cit., the diffusion current components are given by the following equations:

$$I_{diff,p} = -qD_p \frac{n_i^2}{N_D L_p} [e^{\frac{q|V_F|}{kT}} - 1] A_J \quad (6)$$

$$I_{diff,n} = -qD_n \frac{n_i^2}{N_A L_n} [e^{\frac{q|V_F|}{kT}} - 1] A_J \quad (7)$$

wherein:
 $k$ = Boltzmann's constant; and
 $T$ = temperature.

Comparison shows equations (6) and (7) to be identical to equations (3) and (4) above, except for the exponential term. In other words, the diffusion current components under forward bias equal the diffusion current components under reverse bias, multiplied by the exponential factor $[e^{q|V_F|/kT}-1]$ which is a function of the absolute magnitude of the applied voltage $V_F$.

Note that the minority carrier concentrations in $n$ and $p^+$ regions 15 and 16 decrease with increasing distance from depletion region 20c. When the depth $W_B$ of $p^+$ region 16 is greater than the diffusion length $L_n$ (for the case of an n-type substrate), the minority carrier distribution generally is exponential, as indicated schematically by the broken curve 21 in FIG. 2c. That is, under forward bias the concentration of minority carriers (i.e. holes) in $n$ region 15 decreases with increasing distance from depletion region 20c. Similarly, the concentration of excess electrons in $p^+$ region 16 during forward conduction also decreases with increasing distance from depletion region 20c. When the separation distance $W_B$ between terminal 19' and depletion region 20c is much smaller than the diffusion length $L_n$, the distribution of minority carriers in regions 15 and 16 approach straight line rather than exponential form. In this instance, $(W_B << L_n)$ the diffusion length $L_n$ or $L_p$ in equations (6) and (7) may be replaced by the value $W_B$.

The recombination current component $I_{rec}$ for the forward biased prior art junction 14 shown in FIG. 2c is approximated by the following equation:

$$I_{rec} \approx -\frac{1}{2} q \frac{n_i}{\tau_o} W_F e^{\frac{q|V_F|}{2kT}} A_J \quad (8)$$

wherein:
 $W_F$ = the width of forward biased depletion region 20c and is approximated by equation (1) with $\phi_T$ replaced by $[\phi_T - V_F]$. Equation (8) is similar to the generation current $I_{gen}$ under reverse biased condition (see equation (2) above) times an exponential factor which is a function of the absolute magnitude of the forward bias voltage $V_F$.

The total forward current $I_F$ then is given by:

$$I_F = I_{rec} + I_{diff,p} + I_{diff,n} \quad (9)$$

For silicon at room temperature, at small forward voltages the recombination current generally dominates and at forward voltages above about 0.4 to 0.5 volts the diffusion current usually dominates.

As discussed earlier, of considerable practical importance is the time required to switch a junction diode from forward conduction to reverse biased conditions. This reverse recovery time $(T_{rr})$ is the time taken to bring junction 14 from the condition illustrated in FIG. 2c to that illustrated in FIG. 2b.

To understand the mechanisms involved in such junction turnoff, and to obtain an estimate of the reverse recovery time, note that at time $t = o$, when the applied voltage is reversed from $+V_F$ to $-V_R$, a large number of excess minority carriers are present in $n$ and $p^+$ regions 15 and 16, as illustrated by the typical distribution curve 21 of FIG. 2c. As a result, when the voltage first is reversed and before the steady state reverse biased condition is reached, an initial reverse current considerably greater in magnitude than the steady state reverse current $I_R$ flows as a result of the excess minority carriers. This initial current draws holes from the portion of $n$ region 15 adjacent depletion region 20c toward $p^+$ region 16, and creates a minority carrier concentration gradient which eventually permits holes further from region 20c to diffuse toward the junction. Gradually, the excess minority carriers are recombined, and the steady state reverse biased condition illustrated by FIG. 2b is reached.

A rough estimate of the time required for this reverse recovery to take place can be obtained as follows. Under forward biased conditions, the charge density $Q_{n_p}$ per unit area present within $p^+$ region 16 due to injected minority carriers is given by:

(10)

-continued $$Q_{n_p} = \frac{I_F X^2}{2 D_n A_J}$$

where the minority carrier distribution curve may be approximately by a triangle of base X. When the contact is infinitely far away, the distribution is exponential, as discussed above, and X can be approximated by the diffusion length $L_n$. In the instance that $W_B << L_n$, the distribution follows a straight line and X is approximately equal to the distance $W_B$.

If the average reverse current flowing during the turnoff period is $I_{R,ave}$ the turnoff time $t_{off}$ will be given by:

$$t_{off} = \frac{Q_{n_p} A_J}{I_{R,ave}} \quad (11)$$

Combining equations (10) and (11) leads to an estimate of the turnoff time:

$$t_{off} = \left( \frac{I_F}{I_{R,ave}} \right) \frac{X^2}{2 D_n} \quad (12)$$

for the case when $W_B >> L_n$, $$t_{off} \simeq \frac{1}{2} \left( \frac{I_F}{I_{R,ave}} \right) \tau_n \quad (13)$$

and for $W_B << L_n$:

$$t_{off} \simeq \frac{1}{2} \left( \frac{I_F}{I_{R,ave}} \right) \frac{W_B^2}{D_n} \quad (14)$$

Thus the junction turnoff time depends on the ratio of forward and reverse currents, which are determined by the external circuit and on the characteristic time constant $\tau_n$ of the diode. This characteristic time constant is the lifetime of minority carriers if the contact is infinitely far away, and is the diffusion time constant $W_p^2/D_p$ if the contact is much closer than a diffusion length. In this regard, note that gold doping of a prior art junction acts to speed up the reverse recovery time by providing extra recombination centers for the excess minority carriers. In effect, the gold dopant decreases the lifetime ($\tau_n$) or the diffusion time constant terms in the foregoing equations (13) and (14).

The forward recovery time ($T_{fr}$) is associated with the time required to bring the junction 14 from the reverse bias condition shown in FIG. 2b to the forward biased condition shown in FIG. 2c. The significant feature involved here is the build-up of excess minority carriers in the n and p regions 15 and 16. This build-up also is related to the minority carrier lifetimes and to the concentration of recombination-generation centers in the depletion region.

Referring now to FIG. 3, there is shown a semiconductor diode 25 incorporating a "recombination layer" junction 26 in accordance with the present invention. Diode 25 comprises a semiconductor body having a heavily doped substrate portion 27. In the embodiment illustrated, substrate 27 is of n-type conductivity, and is provided with an ohmic contact 28 and associated electrical conductor 29.

Junction 26 (FIG. 3) comprises a relatively lightly doped region 30 of n-type conductivity. Extending into n region 30, from a major face 31 of device 25, is a very thin, relatively highly doped region 32 of conductivity type opposite that of region 30. In the embodiment of FIG. 3, region 32 is of p-type conductivity, and may be formed by ion implantation of an acceptor impurity such as boron, aluminum, gallium or indium. Preferably, the depth of $p+$ region 32 is between about 300 Angstroms and about 800 Angstromg.

Immediately below the lower edge 33 of $p+$ region 32 is a "recombination layer" or region 34 doped to the same conductivity type as heavily doped region 32. In the embodiment of FIG. 3, recombination layer 34 is of p-type conductivity, may have a dopant concentration which is relatively light as compared to the concentration of region 32, but still somewhat greater than n-type region 30. Recombination layer 34 may be formed by ion implantation of the same dopant material used to form region 32. Preferably, the thickness of the recombination layer 34 is between about 50 Angstroms and about 200 Angstroms, the broken line 35 in FIG. 3 representing the lower boundary of recombination layer 34. An ohmic contact 36 and a conductor 37 provide electrical connection to $p+$ region 32 of junction 26.

Alternatively, the inventive junction may comprise a thin, relatively heavily doped region of n-type conductivity disposed within, adjacent to or contiguous with a relatively lightly doped region or body of p-type conductivity. Immediately adjacent this abrupt or "one-sided" junction there may be provided a recombination layer, preferably of from about 50 A to about 200 A in thickness, of n-type conductivity and having a dopant concentration intermediate that of the junction $n+$ and $p$ regions.

Junction 26 may be fabricated using the equipment and technique set forth in the above-mentioned U.S. Pat. No. 3,437,734 entitled "Apparatus and Method for Effecting the Restructuring of Materials". Using this or other ion implantation equipment, p-type dopant ions (e.g., boron, aluminum, gallium or indium) can be imbedded into lightly doped, n-type body 30 to form $p+$ region 32. The ion implantation energy is adjusted so that the dopant ions when braked by the magnetic field present within the semiconductor body will come to rest at a depth less than that of interface 33. That is, the energy is adjusted so that the majority of the implanted dopant ions will lie between surface 31 and a selected maximum depth in the range of from about 300 Angstroms to about 800 Angstroms. Alternatively, n-type dopant ions (e.g., phosphorous, antimony, bismuth or arsenic) may be implanted by like techniques within a p-type semiconductor body.

To form recombination layer 34, the ion implantation energy is increased slightly, for a period of time shorter than that used to form $p+$ (alternatively, $n+$) region 32, during which shorter period of time like dopant ions are embedded further into semiconductor region or body 30, typically to a depth of from 50 Angstroms to 200 Angstroms below interface 33.

The relative dopant concentrations within a typical junction 26 in accordance with the present invention are illustrated by the graph of FIG. 5. As shown therein, the outline of shaded region 32' represents the dopant concentration profile for $P+$ region 32 (FIG. 3).

Also evident in FIG. 5 is the concentration profile 34' of p-type recombination layer 34; note that layer 34 is characterized by a dopant concentration intermediate that of p+ region 32 and n region 30. The relatively low concentration of n-type dopant impurities in region 30 is illustrated by the line 30' in FIG. 5. The broken vertical line 35' designates the approximate lower boundary of recombination layer 34.

Operation of the inventive junction 26 may be understood in connection with FIGS. 4a, 4b and 4c, which illustrate junction 26 under unbiased, reverse biased and forward biased conditions respectively. Referring first to FIG. 4a, junction 26 is shown in the unbiased or equilibrium condition with no voltage applied between terminals 29' and 37', corresponding respectively to electrical connections 29 and 37 in FIG. 3. Under these conditions, a space charge or depletion region 40a will be established in a manner similar to that described in connection with FIG. 2a above.

Under reverse biased conditions (see FIG. 4b), with a negative ($-V_R$) voltage applied at terminal 37', it will be appreciated that recombination layer 34 is considerably thinner than the width $W_R$ of reverse biased depletion region 40b. The steady state reverse current $I_R$ of junction 26 also will include diffusion components arising in n and p+ regions 30 and 32, and a generation current component resulting from electron-hole generation within space charge region 40b. Because recombination layer 34 is very thin in comparison with the width $W_R$ of depletion region 40b, the additional recombination-generation centers introduced in region 34 by the presence of p-type dopant ions does not significantly increase the magnitude of the steady state reverse current.

Under the forward bias conditions illustrated in FIG. 4c, with a positive voltage ($+V_F$) applied to terminal 37', junction 26 conducts heavily in the forward direction, with the current $I_F$ including both diffusion and regeneration components analogous to those discussed in connection with FIG. 2c above. Note that the forward biased depletion region 40c is very thin, and may be commensurate in thickness with, and generally correspond in location to recombination layer 34. Alternatively expressed, recombination layer 34 overlaps depletion region 40c.

Since recombination layer 34 overlaps forward depletion region 40c (see FIG. 4c), the recombination component of the forward current (analogous to $I_{rec}$ in equation (8) above) will be influenced by the presence of additional recombination-generation centers introduced by the p-type dopant concentration (see region 34' in FIG. 5) within layer 34. Thus layer 34 will tend to reduce the effective lifetime $\tau_o$ within depletion region 40c since additional centers are available for recombination in that region. As a result, the forward current component $I_{rec}$ may be increased in value as compared with a prior art junction.

Further, since the depth $W_B$ of p+ region 32 typically is less than about 800 A, and hence generally much thinner than the diffusion length $L_n$ or $L_p$ (i.e. $W_B << L_p$), $W_B$ may be substituted for $L_p$ and $L_n$ in equations (6) and (7) hereinabove. Accordingly, the diffusion current components of the forward current for "recombination layer" junction 26 may be greater in value than prior art diffused junction 14.

Accordingly, for a given forward voltage, "recombination layer" junction 26 will tend to conduct more heavily than a junction 14 in accordance with the prior art. One benefit is that the effective turn-on voltage of the inventive junction 26 will be significantly less than that of a prior art junction. For example, at room temperature, a junction 14 fabricated in silicon may exhibit a forward turn-on voltage of 0.2 volts, as compared with typical turn-on voltages of from 0.4 volts to 0.7 volts for silicon diodes using prior art diffused junctions.

The inventive junction 26 also exhibits significantly faster forward and reverse recovery times than prior art junctions. That this should be so also is evident in conjunction with FIGS. 4b and 4c. First, note that since $W_B << L_p$, the minority carriers in n and p+ regions 30 and 32 under forward biased condition typically may exhibit straight line distributions, typified by broken line 41 in FIG. 4c, decreasing in density linearly with distance from the edge of depletion region 40c. Thus the minority carriers may be concentrated closer to forward biased depletion region 40c in the inventive junction 26 than in prior art junction 14. Thus when junction 26 is switched from forward to reverse bias, the minority carriers may have a shorter distance to diffuse toward depletion region 40c.

More important, depletion region 40c generally coincides with the position of recombination layer 34, so that the dopant ions of layer 34 will provide extra centers facilitating rapid recombination of the excess minority carriers diffusing in from n and p+ regions 30 and 32. As a result, recombination layer junction 14 will reach the reverse biased condition (see FIG. 4b) much faster than a prior art diffused junction. The presence of recombination layer 34 thus significantly increases the reverse recovery time of junction 26, with negligible increase in the steady state reverse current characteristics of the device (as discussed above in connection with FIG. 4b).

Similar considerations indicate that significant improvement in forward recovery time also results from utilization of recombination layer 34. For example, the generation centers associated with the dopant ions in layer 34 provide additional minority carriers for injection into n and $p^{30}$ regions 30 and 32, thereby decreasing the time required to build up the minority carrier concentrations (in regions 30 and 32) associated with forward conduction.

The inventive "recombination layer" junction 26 exhibits high stability in radiation environments. This results in part since no heavy molecular weight constituents are employed in the device. Further, high radiation resistance is inherent in a very thin or shallow junction structure.

The performance of prior art junction 14 and "recombination layer" junction 26, when employed in a clamping application, may be compared using the circuit shown in FIG. 6. Referring thereto, the output of a conventional pulse generator 50 is applied via a current limiting resistor 51 and a clamping diode 52 to an oscilloscope or other utilization means 53. Wave form 55 represents a typical pulse provided by generator 50, which pulse may have an amplitude of from 15 volts to 20 volts, a pulse duration on the order of one microsecond, and rise and fall times each on the order of 10 nanoseconds.

When a prior art diffused junction such as junction 14 shown in FIG. 1 is used for clamping diode 52, the resultant clamped pulse, as viewed on oscilloscope 53, may have the appearance of pulse 56 in FIG. 6. Clamped pulse 56 is characterized by an initial tall spike 57 of amplitude approximately equal to that of generated pulse 55. Spike 57 results because the forward recovery time of prior art diffused junction 14 used for diode 52 is relatively long compared with the rise time of pulse 55. As a result, during the time that diode 52 takes to begin forward conduction, substantially the entire voltage of generated pulse 55 appears across oscilloscope 53.

Upon turn-off of pulse 55, clamped pulse 56 does not immediately drop to zero, but remains at a finite voltage level, represented by the "back porch" 58, for an extended period of time related to the reverse recovery characteristics of prior art junction 14. Finally, clamped pulse 56 decays to zero, as indicated by pulse portion 59. It is thus apparent that prior art diffused junction 14 is unsatisfactory when utilized for clamping pulses of relatively fast rise and fall times.

In contradistinction, the performance of the inventive "recombination layer" junction 26 (FIG. 3), when employed as clamping diode 52, is illustrated by clamped pulse waveform 60 of FIG. 6. As a result of the very fast forward and reverse recovery times of junction 26, generated pulse 55 is clamped very effectively, even though that generated pulse exhibits rapid rise and fall times. Clamped pulse 60 itself exhibits a square waveshape having rise and fall times commensurate with those of the pulse 55 being clamped, but with an amplitude related to the forward characteristics of junction 26. Comparison of clamped pulse waveforms 56 and 60 (FIG. 6) shows the significant improvement in clamping characteristics achieved by utilizing the inventive "recombination layer" junction 26.

While the invention has been described with respect to the preferred physical embodiments constructed in accordance therewith, it will be apparent to those skilled in the art that various modifications and improvements may be made without departing from the scope and spirit of the invention.

We claim:

1. An ion implanted PN junction, having a forward biased depletion region when forward bias is applied across the junction, a reverse biased depletion region when reverse bias is applied across the junction, and a steady state reverse current characteristic, said junction comprising:
   a first region and a second region, said first region being relatively highly doped when compared to said second region and being adjacent to said second region, said second region being relatively lightly doped when compared to said first region and being of opposite conductivity type, and a thin intermediately doped recombination layer immediately adjacent said junction and of the same conductivity type as the relatively highly doped one of said regions, said thin intermediately doped recombination layer constituting recombination means overlapping the forward biased depletion region of the junction with a thickness much less than that of the reverse biased junction depletion region under reverse bias, for providing dopant ion-recombination-generation centers so located that the forward and reverse recovery times of the junction are improved without degrading the steady state reverse current characteristics of the junction.

2. A junction as defined in claim 1 wherein said one relatively highly doped region has a depth of between about 300 A and about 800 A, and wherein said recombination layer has a thickness between about 50 A and about 200 A.

3. A PN junction as defined in claim 1 wherein said junction has a zero bias depletion region when zero bias is applied to said junction, and wherein the thickness of said recombination layer is less than the thickness of the zero bias depletion region of said junction.

4. A semiconductor junction comprising:
   a first relatively heavily doped region of one conductivity type,
   a second relatively lightly doped region of opposite conductivity type, and
   a thin recombination layer of said one conductivity type between said first and second regions and of dopant concentration intermediate that of said first and second regions wherein the depth of said first region is between about 300 A and about 800 A, and wherein said recombination layer has a thickness between about 50 A and about 200 A.

5. A PN junction as defined in claim 1 wherein the thickness of said recombination layer is substantially equal to the thickness of said forward biased depletion region.

6. A junction as defined in claim 1 wherein said recombination-generation centers are provided in a narrow portion only of said reverse bias depletion region.

7. A junction as defined in claim 1 wherein said recombination layer is formed by ion implantation.

8. A junction as defined in claim 1 further comprising an ohmic contact disposed on said first region.

9. A junction as defined in claim 8 further comprising a relatively heavily doped substrate of said opposite conductivity type adjacent said second region, and another ohmic contact disposed on said substrate.

10. A junction as defined in claim 9 wherein said substrate and said second region are of n-type conductivity, and wherein said first region and said recombination layer are of p-type conductivity and are formed by ion implantation of boron, aluminum, gallium or indium dopant ions.

11. A junction as defined in claim 9 wherein said substrate and said second region are of p-type conductivity, and wherein said first region and said recombination layer are of n-type conductivity and are formed by ion implantation of phosphorous, antimony, bismuth or arsenic dopant ions.

12. A diode having fast forward and reverse recovery times, comprising:
   a semiconductor body having a first region (30) that is doped to a first concentration with impurities of a first conductivity type,
   a second region (32) formed by ion implantation of impurities of a second conductivity type opposite said first conductivity type, said second region extending into said body from a face thereof a well-defined first depth, thereby forming a junction at said first depth, the impurity concentration of said second region being greater than said first concentration, and
   a recombination layer (34) formed by ion implantation of impurities of said second conductivity type immediately subjacent said second region, the impurity concentration in said recombination layer being intermediate that of said first and second regions, the thickness of said recombination layer being on the same order as the thickness of the depletion region (40c) present within said diode when said junction is forward biased, said second conductivity impurities in said recombination layer providing recombination centers for excess minority carriers defusing into said recombination layer from said first and second regions so as to decrease the reverse recovery time of said diode, said second conductivity impurities in said recombination layer also serving as generation centers to provide additional minority carriers for injection into said first and second regions, thereby decreasing the forward recovery time of said diode.

* * * * *